(12) United States Patent
Monson et al.

(10) Patent No.: US 6,814,277 B2
(45) Date of Patent: Nov. 9, 2004

(54) LEAD FRAME SUBSTRATE CLAMP AND METHOD

(75) Inventors: Robert James Monson, St. Paul, MN (US); Richard L. Cellini, St. Michael, MN (US); Roger J. Karnopp, Eagan, MN (US)

(73) Assignee: Lockheed Martin

( * ) Notice: Subject to any disclaimer, the term of this patent is extended or adjusted under 35 U.S.C. 154(b) by 23 days.

(21) Appl. No.: 10/319,936

(22) Filed: Dec. 16, 2002

(65) Prior Publication Data

US 2004/0112943 A1 Jun. 17, 2004

(51) Int. Cl.[7] .......................... B23K 31/00; B23K 37/04
(52) U.S. Cl. ...................... 228/212; 228/44.7; 228/49.5
(58) Field of Search ................... 228/212, 213, 228/44.3, 44.7, 49.1, 49.5

(56) References Cited

U.S. PATENT DOCUMENTS

| | | | | |
|---|---|---|---|---|
| 4,193,834 A | * | 3/1980 | Bernardi | 156/521 |
| 4,954,872 A | * | 9/1990 | Peterson et al. | 257/670 |
| 5,082,165 A | * | 1/1992 | Ishizuka | 228/179.1 |
| 5,238,174 A | * | 8/1993 | Ricketson et al. | 228/180.21 |
| 5,307,978 A | * | 5/1994 | Ricketson et al. | 228/4.5 |
| 5,372,972 A | * | 12/1994 | Hayashi et al. | 29/827 |
| 5,406,699 A | * | 4/1995 | Oyama | 29/827 |
| 5,813,590 A | * | 9/1998 | Fogal et al. | 228/4.5 |
| 5,839,640 A | * | 11/1998 | Kinnaird | 228/4.5 |
| 5,890,644 A | * | 4/1999 | Ball | 228/44.7 |
| 5,971,256 A | * | 10/1999 | Fogal et al. | 228/212 |
| 6,068,174 A | * | 5/2000 | Ball et al. | 228/4.5 |
| 6,307,755 B1 | | 10/2001 | Williams et al. | 361/813 |
| 6,602,726 B1 | * | 8/2003 | Malolepszy et al. | 438/14 |

FOREIGN PATENT DOCUMENTS

JP          404364049 A   * 12/1992

* cited by examiner

*Primary Examiner*—Kiley Stoner

(57) ABSTRACT

A method of securing articles to each other and an alignment and holding apparatus comprising a platform having an alignment member for positioning and holding a first article, such as a substrate, in a first position and a further alignment member for aligning extensions of a second article, such as a lead frame, in an assembleable position with respect to the first article while a spacer maintains the extensions in proper lateral position and a clamp that secures the extensions proximate the first article while an electrical connection is formed between the first article and the extensions of the second article.

16 Claims, 3 Drawing Sheets

LEAD FRAME SUBSTRATE CLAMP AND METHOD

FIELD OF THE INVENTION

This invention relates generally to an apparatus and a method of precision alignment mounting and holding articles during a securement process and, more specifically, to apparatus and method for mounting and holding a lead frame as the electrical leads are secured to a substrate.

CROSS REFERENCE TO RELATED APPLICATIONS

None

STATEMENT REGARDING FEDERALLY SPONSORED RESEARCH OR DEVELOPMENT

None

REFERENCE TO A MICROFICHE APPENDIX

None

BACKGROUND OF THE INVENTION

The surface mounting of lead frames to a substrate is known in the art U.S. Pat. No. 6,307,755 shows and describes a number of methods for mounting a lead frame to a substrate. In contrast, the present invention provides a method and apparatus for first positioning two or more articles with respect to each other and then securing the articles to each other and, more specifically, it enables small delicate elements, such as the elongated electrical leads of a lead frame, to be quickly and properly positioned with respect to a substrate. Once positioned the electrical leads are then temporarily held in a securement position by a pressure clamp followed by the in situ securement of the leads of the lead frame to the substrate.

SUMMARY OF THE INVENTION

Briefly, the present invention comprises a method of securing articles to each other and an alignment and holding apparatus comprising a platform having an alignment member for positioning and holding a first article, such as a substrate, in a first position and a further alignment member for aligning extensions of a second article, such as a lead frane, in an assembleable position with respect to the first article while a spacer maintains the extensions in proper lateral position. A clamp secures the extensions proximate the first article while an electrical connection is formed between the first article and the extensions.

DESCRIPTION OF THE PREFERRED EMBODIMENT

Figure 1:
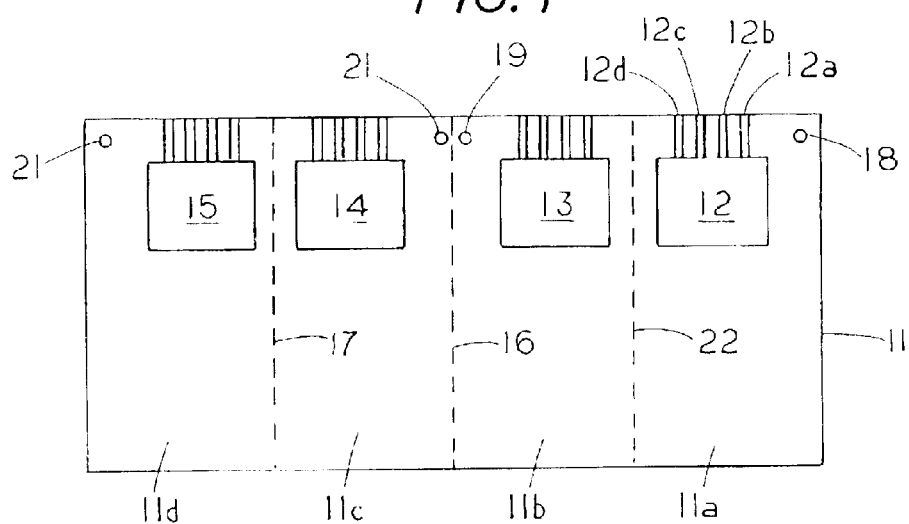
FIG. 1 is a top view of a plurality of substrates mounted in a side-by-side condition on a support sheet.

FIG. 1 is a top view of a plurality of articles such as substrates 12, 13, 14 and 15 which are mounted in a side-by-side condition on a support sheet 11. In the embodiment shown support sheet 11 comprises four distinct separable regions 11a, 11b, 11c and 11d. Regions 11a and 11b are separated by a break line comprising a partially severed region 22 to enable the separation of support sheet 11a from support sheet 11b by bending adjacent sections. Similarly, regions 11b and 11c are separated by a break line comprising a partially severed region 16 to enable the separation of support sheet 11b from support sheet 11c and regions 11c and 11d are separated by a break line comprising a partially severed region 17 to enable the separation of support sheet 11d from support sheet 11c. By mounting multiple substrates on a support sheet one can simultaneously align all the substrates on the support sheet and simultaneously secure the substrates to another article. Once secured the individual substrates can be separated. Thus, one of the purposes of mounting multiple substrates on a single support sheet is to permit assembly and attachment of multiple lead frames to corresponding substrates. While four substrates are shown more or less substrates could be assembled using the present apparatus and method.

Although a support sheet 11 is shown as separable to permit multiple attachments, if desired, each of the substrates can be integral to a support sheet which is non-separable.

Mounted on support sheet 11 are substrates 12, 13, 14 and 15. In the embodiment shown each of the substrates are identical and only one will be described herein. Substrate 12 includes electrically conducting leads 12a, 12b, 12c and 12d extending outwardly from substrate 12 with each of the leads in a laterally spaced condition from each other. The leads are to be connected to the electrically conducting leads of another article such as a lead frame.

In the embodiment shown the support sheet 11 includes a set of locators or alignment holes 18, 19, 20 and 21 which comprises circular holes that have been etched in support sheet 11. By etching the alignment holes in support sheet 11 one can obtain precise location of the alignment holes in the support sheet 11 which allows one to precisely position the support sheet on a substrate platform and consequently precisely position the leads on support sheet 11 in a condition for securement to the leads of a lead frame. Thus, by positioning the alignment holes on alignment members such as guide pins on a substrate platform one can quickly orientate the leads of the substrate to a known position. Similarly, by using the same substrate platform having a further alignment member for the lead frame one can quickly position the leads of the substrate with respect to the leads on the lead frane. In order to appreciate the alignment and securement process reference should be made to FIGS. 2–8.

Figure 2:
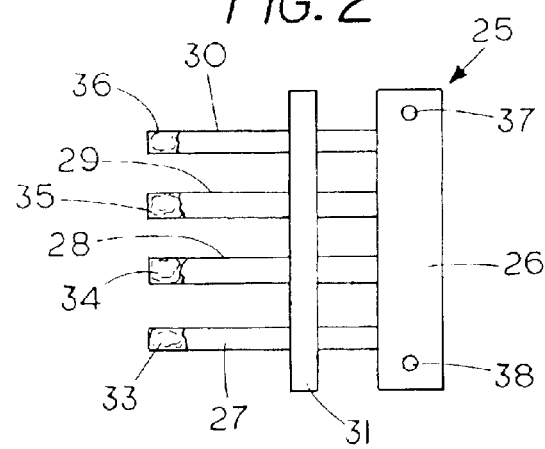
FIG. 2 is a top view of a lead frame having a plurality of electrically conducting leads that are held in a spaced condition by a non-conducting material.

FIG. 2 is a top view of a lead frame 25 having a plurality of electrically conducting leads 27, 28, 29 and 30 that are held in a spaced condition by a traversely extending non-conducting member 31. Typically, lead frame 25 can be etched from a sheet of electrical conducting material such as metal or the like. During the manufacturing process, one can leave a separable cross piece 26 having holes 37 and 38 with electrical conducting leads 27, 28 29 and 30 extending from the separable and disposable cross piece 26. Each of the leads 27, 28 29 and 30 are held in a spaced condition by non-conducting member 31 which can be secured thereto by an adhesive or the like. The purpose of member 31 is two fold, first as each of the electrical conducting leads are small and can easily be bent the member 31 functions to hold the leads in a rigid arrangement. Second, since the member 31 is secured to the leads, it can be used as a locating guide to position the ends of the electrical leads on a substrate platform. In the embodiment shown lead 27 has a coating of solder and flux 33. Similarly, lead 28 has a coating of solder and flux 34, lead 29 has a coating of solder and flux 35 and lead 23 has a coating of solder and flux 36.

Figure 3:
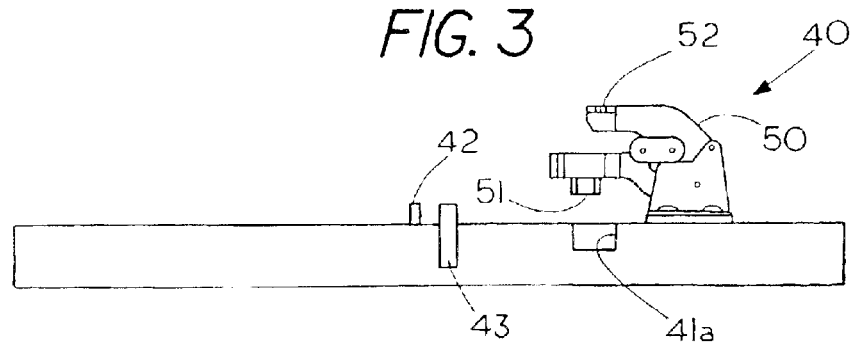
FIG. 3 is a side view of the apparatus for holding a substrate and the leads of a lead frame in an assembleable condition.

FIG. 3 is a side view of the apparatus 40 for holding a substrate and a lead frame in an assembleable condition. Apparatus 40 includes a substrate platform 41 having a first set of alignment members 42 comprises cylindrical guide pins (see FIG. 4) that extend perpendicularly outward from platform 41 for aligning and holding support sheet 11 so that the alignment holes 18, 19, 20 and 21 engage the alignment members 43 thereby precisely locating the substrates thereon. Referring to FIG. 3, located laterally of alignment member 42 is a lead separation member 43 which is held in position in a slot in platform 41. Lead separation member 43 is refereed to as a comb since it contains a set of parallel extending teeth.

Figure 5:
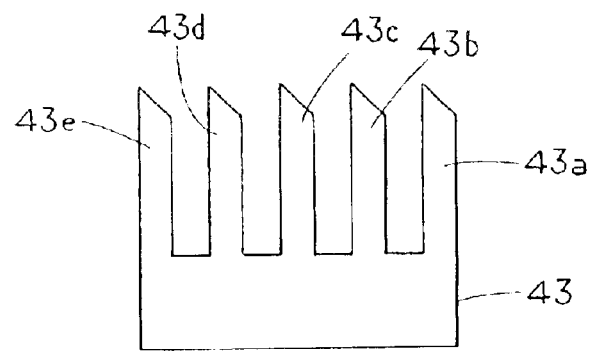
FIG. 5 shows a separator member having a plurality of elongated tines or fingers for holding the leads of a lead frame in a spaced condition during the assembly process.

FIG. 5 shows a front view of comb 43 illustrating the fingers 43a, 43b, 43c, 43d and 43c that extend outward from each other in a parallel relationship. Each of the fingers or teeth are sufficiently rigid so as to maintain the spacing therebetween. In the embodiment shown the comb 43 is positioned so as to engage and maintain the separation of the leads on the lead frame during the assembly process and to ensure the leads are located properly with respect to the substrate platform. In order to facilitate insertion of the leads therearound the ends of the fingers are provided with a tapered end surface.

Located on platform 41 is a pressure clamp 50 having a movable jaw 51 that can be extended to apply normal pressure to hold a lead frame in a fixed position on the platform 41. Lead frame clamp 50 includes a handle 52 to allow one to apply or remove clamping pressure to a lead frame positioned on the platform 41.

Figure 4:
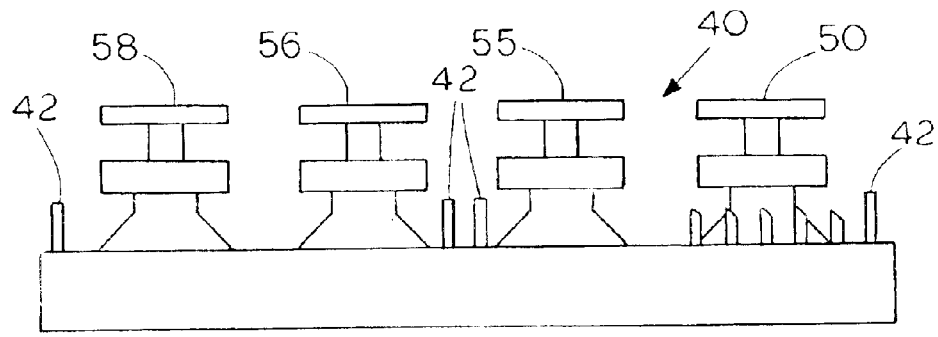
FIG. 4 is a front view of the apparatus of FIG. 4 showing a plurality of lead frame clamping members arranged in a side-by-side condition.

FIG. 4 shows a front view of the apparatus 40 showing that four clamps 50, 55, 56 and 58 are mounted in a side-by-side condition for securing a plurality of lead frames to a substrate. The purpose of using multiple clamps is that individual lead frames do not have to be ganged together as they can be individually positioned and aligned with respect to a substrate on the support sheet.

Figure 6:
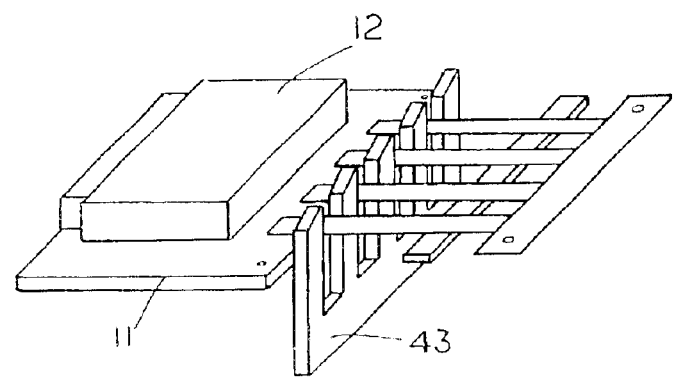
FIG. 6 is a partial perspective view showing a substrate and a lead frame positioned proximate each other with the elongated separator elements holding the electrically conducting leads on the lead frame in a spaced condition.

FIG. 6 shows an isolated perspective view illustrating how the substrate 12, comb 43 and lead frame 25 are positioned during the assembly process. In the embodiment shown the lead frame ends are to be soldered or electrically connected unto leads extending from substrate 12.

Figure 7:
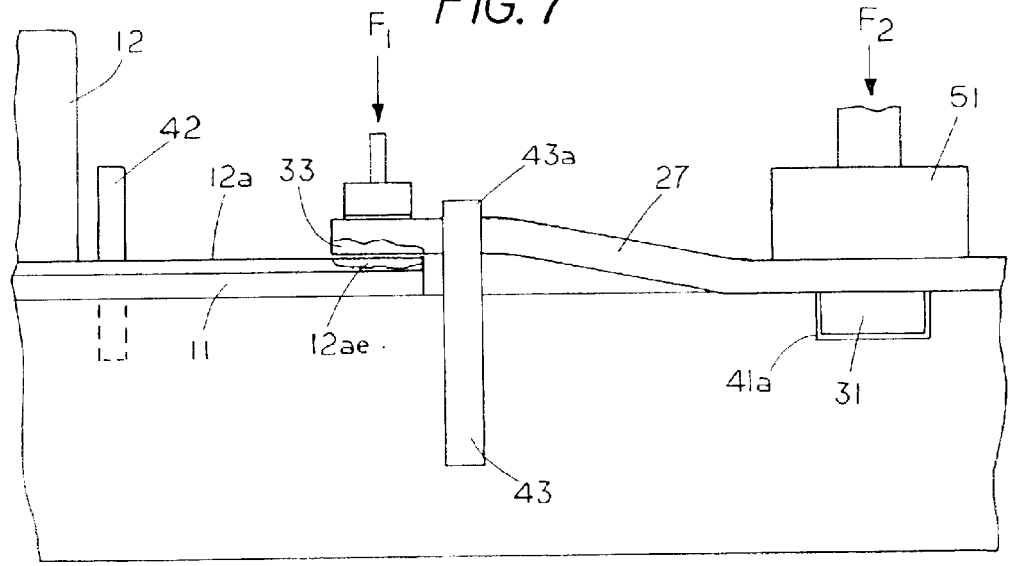
FIG. 7 is a partial side view showing a substrate and lead frame held in a clamped condition by a lead frame clamp.

FIG. 7 shows a partial enlarged side view of the substrate platform 41 and support sheet 11 with support sheet 11 carrying an electrical lead 12a from substrate 12. Electrical lead 12a is in an aligned condition with lead 27 on lead frame 25. In the view showing in FIG. 7 the finger 43a is positioned on one side lead 27 and the end of lead 27 is positioned over lead 12a with the solder and pastes 33 on lead 27 in engagement with solder and paste 12ae on lead 12. The lead 27 is further held in position by dielectric alignment member 31 which is located in alignment recess 41a in platform 41. The movable jaw 51 is shown clamping lead 27 in position . Located on top of the end of lead 27 is a pressure heating element 70 for heating the end of lead 27 to cause the solder to flow and solder the end of lead 12a and end of lead 27 to each other.

Figure 8:
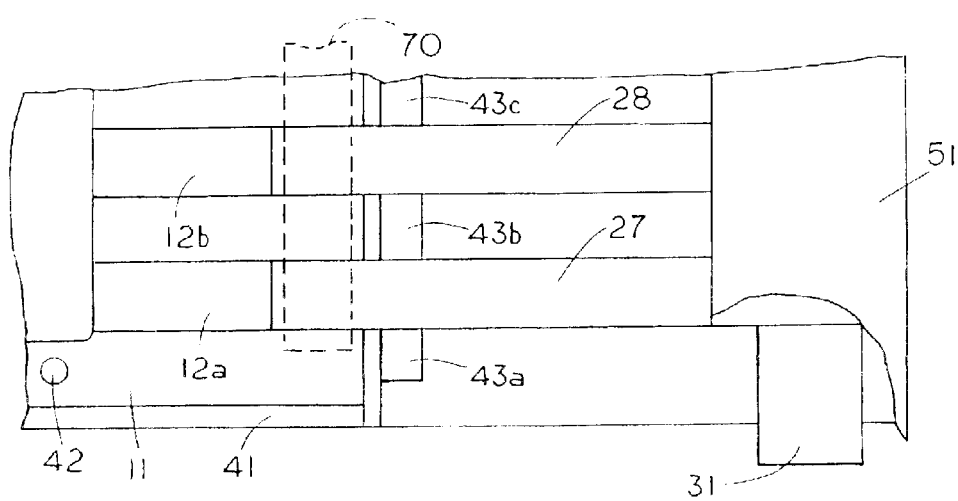
FIG. 8 is a partial top view showing the substrate and lead frame of FIG. 7 held in a clamped condition by the lead frame clamp.

A reference to FIG. 8 shows a partial top view of the substrate platform 41 shown in FIG. 7. In the embodiment shown each of electrical leads 27 and 28 are spaced from each other by a finger separation member 43, that is a first finger 43a is on one side of lead 27 and a second finger 43b is on the opposite side of separating member 27. A third separating finger 43c is locate on the opposite side of lead 28. While only two leads are shown in FIG. 8, it is to be understood that multiple leads can be positioned in the side-by-side and aligned condition shown in FIG. 8.

In the embodiment shown the lead 27 and lead 12a are in alignment with each other as are leads 12b and leads 28. Thus it will be seen that the positioning of the support member 11 through alignment member 42 and the corresponding positioning of leads 27 and 28 by the recess 41a in member 41 produces the aligned overlapping condition as shown in FIG. 8. To hold the leads 27 and 28 in place during the securement process the movable jaw 51 clamps on the top of lead 27 and 28 to hold the leads and the transverse member 31 in the alignment recess 41a in the substrate platform 41. As a result the ends of leads 27 and 28 form top alignment with leads 12b and 12a. The platen 70 for conduction heating the leads 27 and 28 is shown in dotted lines to indicate the positioning for heating to cause the ends of leads 12b, and 12a to be respectively secured to lead 28a and 27 through the melting and subsequent solidification of the solder on the leads.

We claim:

1. An alignment and holding fixture comprising:

a substrate platform;

a lead frame clamp mounted on said substrate platform;

a lead frame alignment member on said substrate platform;

a substrate alignment member on said substrate platform to hold a substrate in a fixed reference position to thereby enable a plurality of leads on a lead frame to be positioned and held in an attachment condition with respect thereto by the lead frame clamp; and a comb for maintaining the plurality of leads on the lead frame in a spaced condition.

2. The alignment and holding fixture of claim 1 wherein the lead frame clamp includes a movable jaw that applies normal pressure to the lead frame to prevent displacement of the lead frame during the securement process.

3. The alignment and holding fixture of claim 1 wherein the substrate platform includes a plurality of lead frame clamps.

4. An alignment and holding fixture comprising:

a substrate platform;

a lead frame clamp mounted on said substrate platform;

an alignment recess located in said substrate platform; and a substrate alignment member on said substrate platform to hold a substrate in a fixed reference position to thereby enable a plurality of leads on a lead frame to be positioned and held in an attachment condition with respect thereto by the lead frame clamp.

5. The alignment and holding fixture of claim 2 wherein the lead frame clamp includes a handle for clamping the movable jaw to apply normal pressure to the lead frame.

6. A alignment and holding fixture comprising:
a substrate platform, said substrate platform including a plurality of substrate alignment pins;
a lead frame clamp mounted on said substrate platform;
a lead frame alignment member on said substrate platform; and
a substrate alignment member on said substrate platform to hold a substrate in a fixed reference position to thereby enable a plurality of leads on a lead frame to be positioned and held in an attachment condition with respect thereto by the lead frame clamp.

7. The method of attaching a lead frame to a substrate comprising the steps of:
positioning a substrate on a substrate platform;
mounting the substrate on a support sheet having alignment guides therein;
placing a plurality of leads on a lead frame proximate the substrate;
temporarily clamping the lead frame to the substrate platform to maintain the plurality of leads in a fixed condition proximate the substrate; and
securing the plurality of leads to the substrate as the lead frame is maintained in the fixed condition proximate the substrate.

8. The method of claim 7 including the step of extending a separation member between the plurality of leads on a lead frame to maintain the plurality of leads in a spaced condition.

9. The method of claim 7 including the step of applying a solder to the plurality of leads.

10. The method of claim 9 including the step of heating the plurality of leads carrying the solder to thereby solder the plurality of leads to the substrate.

11. The method of claim 7 including the mounting of a plurality of substrates in a side-by-side condition on the substrate alignment platform.

12. The method of claim 7 wherein the step of clamping comprises bringing a movable jaw into perpendicular contact with the plurality of leads on the lead frame.

13. The method of claim 7 including mounting a plurality of substrates in a side-by-side condition on a substrate support having a set of alignment guides therein.

14. The method of claim 13 wherein the step of placing a plurality of leads on a lead frame proximate the substrate comprises the step of mounting a plurality of lead frames with each of the plurality of lead frames being located in a side-by-side condition.

15. The method of claim 7 including the step of positioning the substrate on an alignment member on the substrate platform and positioning the lead frame on a further alignment member on the substrate platform.

16. The method of attaching a lead frame to a substrate comprising the steps of;
positioning a substrate on a substrate platform;
placing a plurality of leads on a lead frame proximate the substrate;
temporarily clamping the lead frame to the substrate platform to maintain the plurality of leads in a fixed condition proximate the substrate;
securing the plurality of leads to the substrate as the lead frame is maintained in the fixed condition proximate the substrate; and
mounting of multiple substrates on a support sheet for securing to another article followed by separation of the multiple substrates by severing the support sheet.

* * * * *